United States Patent
Cola et al.

(10) Patent No.: US 10,468,327 B2
(45) Date of Patent: Nov. 5, 2019

(54) METHODS FOR REDUCING THERMAL RESISTANCE OF CARBON NANOTUBE ARRAYS OR SHEETS

(71) Applicant: Georgia Tech Research Corporation, Atlanta, GA (US)

(72) Inventors: Baratunde Cola, Atlanta, GA (US); Virendra Singh, Atlanta, GA (US); Thomas L. Bougher, Atlanta, GA (US); John H. Taphouse, Linden, MI (US)

(73) Assignee: Georgia Tech Research Corporation, Atlanta, GA (US)

( * ) Notice: Subject to any disclaimer, the term of this patent is extended or adjusted under 35 U.S.C. 154(b) by 835 days.

(21) Appl. No.: 14/345,897

(22) PCT Filed: Sep. 21, 2012

(86) PCT No.: PCT/US2012/056661
§ 371 (c)(1),
(2) Date: Mar. 19, 2014

(87) PCT Pub. No.: WO2013/044094
PCT Pub. Date: Mar. 28, 2013

(65) Prior Publication Data
US 2014/0227477 A1 Aug. 14, 2014

Related U.S. Application Data

(60) Provisional application No. 61/537,253, filed on Sep. 21, 2011.

(51) Int. Cl.
*B32B 9/00* (2006.01)
*H01L 23/373* (2006.01)
(Continued)

(52) U.S. Cl.
CPC .......... *H01L 23/3735* (2013.01); *C25D 7/006* (2013.01); *H01L 23/373* (2013.01);
(Continued)

(58) Field of Classification Search
CPC ........ C01B 31/022–0293; B82Y 30/00; Y10T 428/30
(Continued)

(56) References Cited

U.S. PATENT DOCUMENTS 8,512,546 B2  8/2013  Iyengar
2003/0122111 A1*  7/2003  Glatkowski ............ B82Y 10/00
                                                                252/500
(Continued)

FOREIGN PATENT DOCUMENTS

EP  1820870  8/2007
EP  2187440  5/2010
(Continued)

*Primary Examiner* — Daniel H Miller
(74) *Attorney, Agent, or Firm* — Pabst Patent Group LLP

(57) ABSTRACT

Carbon nanotube (CNT) forests or sheets coated and/or bonded at room temperature with one or more coatings were measured to produce thermal resistances that are on par with conventional metallic solders. These results were achieved by reducing the high contact resistance at CNT tips and/or sidewalls, which has encumbered the development of high-performance thermal interface materials based on CNTs. Resistances as low as 4.9±0.3 $mm^2$–K/W were achieved for the entire polymer-coated CNT interface structure.

27 Claims, 6 Drawing Sheets

(51) Int. Cl.
*H01L 23/42* (2006.01)
*C25D 7/00* (2006.01)
*B82Y 30/00* (2011.01)

(52) U.S. Cl.
CPC .............. *H01L 23/42* (2013.01); *B82Y 30/00* (2013.01); *H01L 2924/0002* (2013.01); *Y10T 428/24* (2015.01); *Y10T 428/30* (2015.01)

(58) Field of Classification Search
USPC ................ 428/408; 423/447.1, 448; 252/500
See application file for complete search history.

(56) References Cited

U.S. PATENT DOCUMENTS

| | | | |
|---|---|---|---|
| 2004/0058153 A1* | 3/2004 | Ren | B01J 23/76 428/408 |
| 2004/0261987 A1* | 12/2004 | Zhang | B82Y 10/00 165/183 |
| 2007/0114658 A1* | 5/2007 | Dangelo | B82Y 10/00 257/720 |
| 2007/0187840 A1* | 8/2007 | Dell'Acqua-Bellavitis | A61B 5/00 257/784 |
| 2008/0063860 A1* | 3/2008 | Song | B32B 27/08 428/336 |
| 2008/0280137 A1 | 11/2008 | Ajayan | |
| 2009/0308458 A1* | 12/2009 | Aramaki | B82Y 10/00 136/263 |
| 2010/0190023 A1* | 7/2010 | Gross | H01L 23/373 428/545 |
| 2011/0032678 A1 | 2/2011 | Altman | |

FOREIGN PATENT DOCUMENTS

| | | |
|---|---|---|
| EP | 2546871 | 1/2013 |
| JP | 2011096832 | 5/2011 |
| WO | 2011057105 | 5/2011 |

* cited by examiner

METHODS FOR REDUCING THERMAL RESISTANCE OF CARBON NANOTUBE ARRAYS OR SHEETS

CROSS-REFERENCE TO RELATED APPLICATIONS

This application is a § 371 application of the International Application No. PCT/US2012/056661 entitled "Methods for Reducing Thermal Resistance of Carbon Nanotube Arrays or Sheets", filed in the United States Receiving Office for the PCT on Sep. 21, 2012, which claims the benefit of and priority to U.S. Ser. No. 61/537,253 entitled "Methods of Bonding Nanostructures with Nanoscale Polymer Coatings" filed on Sep. 21, 2011. The content of the above-referenced application is incorporated by reference in its entirety.

FIELD OF THE INVENTION

This invention is in the field of carbon nanotube arrays or sheets, particularly coated carbon nanotube arrays or sheets exhibiting reduced thermal resistance and methods of making and using thereof.

BACKGROUND OF THE INVENTION

As the semiconductor industry continually strives to increase the power density of single chip packages, thermal management remains a critical challenge toward realizing both performance and reliability metrics. One of the problems inhibiting effective thermal management is the several interfaces that can exist between the chip and heat sink. Specifically, the thermal resistance of the thermal interface materials (TIMs) that are currently used to bridge these interfaces must be decreased.

Carbon nanotubes (CNTs) with their extraordinarily high axial thermal conductivity have generated tremendous interest as candidates for low resistance TIMs. The most promising CNT TIMs produced to date contain vertical forests, where the CNT axis is nominally aligned orthogonal to the contact surfaces providing maximum conductivity in this direction. This alignment also provides maximum mechanical compliance along the contact surfaces to mitigate deleterious effects of mismatches in the coefficients of thermal expansion of the interface materials. However, even in this arrangement CNT TIMs demonstrated limited performance due to the presence of high thermal contact resistances between the CNT tips and opposing surfaces.

Efforts to mitigate this contact resistance have centered on different methods for bonding the CNT tips to the opposing surface and have included metallic film bonding, palladium nanoparticle bonding, and wet chemical modification of Si. While these techniques have in some cases produced CNT TIMs with thermal resistances approaching those of conventional TIMs, they often require high-cost materials, such as Au or In, and processing, including metal thin film deposition, high temperature and high pressure bonding, and even exposure to microwave radiation, that aren't favorable for large-scale implementation. Moreover, these processes typically result in a permanent modification to the CNT tips which cannot be reworked or removed.

There exists a need for a scalable, low-cost process for improving the thermal resistance of carbon nanotubes and devices made by these methods.

Therefore, it is an object of the invention to provide a scalable, low-cost process for improving the thermal resistance of carbon nanotubes and devices formed by the method.

It is also an object of the invention to provide methods for reducing the thermal resistance of CNT arrays or sheets, wherein the methods result in a coating or modification which can be removed to form a clean surface which can again be coated or modified.

SUMMARY OF THE INVENTION

Coated carbon nanotube (CNT) arrays and sheets and methods of making and using thereof are described herein. The CNT arrays can be prepared using any technique known in the art. In one embodiment, the CNT arrays are prepared using multilayer substrates containing three or more layers deposited on an inert support, such as a metal surface. Generally, the multilayer substrate contains an adhesion layer, an interface layer, and a catalytic layer, deposited on the surface of an inert support.

The CNT sheets can be also be prepared using techniques known in the art. In one embodiment, the CNT sheets are made by vacuum filtration of CNT powder. In another embodiment, CNT sheets are formed by collecting CNT powder in-situ inside a growth chamber on a metal foil substrates and then densifying the sheets by evaporating solvent from the sheets.

Once the array or sheet is prepared, the array or sheet is coated with one or more materials, such as polymeric materials, in an amount effective to reduce the thermal resistance of the array or sheet compared to the uncoated array or sheet. In some embodiments, the CNT coating(s) is present in an amount effective to reduce the thermal resistance of the array or sheet by about 25%, 30%, 35%, 40%, 45%, 50%, 55%, 60%, 65%, 70%, or greater compared to the uncoated array or sheet. In other embodiments, the coated array or sheet exhibits thermal resistance less than about 5.0, 4.5, 4.0, 3.5, 3.0, 2.5, 2.0, 1.5 $mm^2K/W$. In some embodiments, the thermal resistance is about 2, preferably about 1 $mm^2K/W$.

The coatings are preferably stable, wherein the thermal resistance of the coated array or sheet after the array or sheet is baked at 130° C. and 680 mbar for 110 hours in a vacuum oven, is within 1%, 2%, 3%, 4%, 5%, 7%, 10%, 15%, 20%, 25%, or 30% of the thermal resistance of the coated array or sheet prior to baking.

The coatings are preferably polymers or molecules that bond to CNTs through van der Waals bonds, π-π stacking, or covalent bonds and bond to metal, metal oxide, or semiconductor material surfaces through van der Waals bonds, π-π stacking, or covalent bonds.

Suitable coating materials include conjugated and non-conjugated polymers. Suitable conjugated polymers include aromatic (including heteroaromatic) and non-aromatic polymers. Examples of conjugated polymers include, but are not limited to, polythiophenes (including alkyl-substituted polythiophenes), polystyrenes, polypyrroles, polyacetylenes, polyanilines, polyfluorenes, polyphenylenes, polypyrenes, polyazulenes, polynaphthalenes, polycarbazoles, polyindoles, polyazepines, poly(3,4-ethylenedioxythiophenes), poly(p-phenyl sulfides), and poly(p-phenylene vinylene). Suitable non-aromatic, conjugated polymers include, but are not limited to, polyacetylenes and polydiacetylenes. The polymer classes listed above include substituted polymers, wherein the polymer backbone is substituted with one or more functional groups, such as alkyl groups. In some embodiments, the polymer is polystyrene (PS). In other embodiments, the polymer is poly(3-hexythiophene) (P3HT). In other embodiments, the polymer is poly(3,4-

3thylenedioxythiophene) (PEDOT) or poly(3,4-3thylenedioxythiophene) poly(styrenesulfonate) (PEDOT:PSS).

In other embodiments, the polymer is a non-conjugated polymer. Suitable non-conjugated include, but are not limited to, polyvinyl alcohols (PVA), poly(methyl methacrylates) (PMMA), polydimethylsiloxanes (PDMS), and combinations (blends) thereof.

In other embodiments, the polymer is a paraffin wax. In other embodiments, the polymer is a synthetic wax such as Fischer-Tropsch waxes or polyethylene waxes. In other embodiments, the polymer is a wax that has a melting temperature above 80, 90, 100, 110, or 120° C., preferably above 130° C. In other embodiments, the polymer is a hot glue or hot melt adhesive that combines wax, tackifiers and a polymer base to provide improved surface adhesion. In other embodiments, the polymer is a pressure sensitive adhesive.

The coated array or sheet can further be coated with a plurality of metallic nanoparticles and/or flowable or phase-changing materials. One or more metal nanoparticles may be adsorbed to the distal ends and/or sidewalls of the CNTs to bond the distal ends and/or sidewalls of the CNTs to a surface, reduce thermal resistance between the CNT array or sheet and a surface, or combinations thereof. Metal nanoparticles can be applied to CNT arrays using a variety of methods known in the art. Examples of suitable metal nanoparticles include palladium, gold, silver, titanium, iron, nickel, copper, and combinations thereof.

Flowable or phase change materials may be added to the CNT array or sheet to displace the air between CNTs and improve contact between the distal ends and/or sidewalls of CNTs and a surface, and as a result reduce thermal resistance of the array or sheet and the contact between the array or sheet and a surface, or combinations thereof. Flowable or phase change materials can be applied to CNT arrays or sheets using a variety of methods known in the art. Examples of suitable flowable or phase change materials include paraffin waxes, polyethylene waxes, hydrocarbon-based waxes in general, and blends thereof. Other examples of suitable flowable or phase change materials that are neither wax nor polymeric include liquid metals, oils, organic-inorganic and inorganic-inorganic eutectics, and blends thereof. In some embodiments, the coating material described above is a flowable or phase change material, such as a wax.

The coated CNTs can be abutted or bonded to a thermally conducting top substrate to prepare a device for evaluating thermal resistance or a heat source, such as an integrated circuit package, to form a commercial product.

The coated CNT arrays or sheets described herein can be used as thermal interface materials. For example, in one embodiment, the inert support for the coated CNT array is a piece of metal foil, such as aluminum foil. In some instances only one surface (i.e., side) of the metal foil contains a coated array of aligned CNTs anchored to the surface. In other cases, both surfaces (i.e., sides) of the metal foil contain a coated array of aligned CNTs anchored to the surface. As another example, CNT sheets can be coated on one or both sides and do not require an inert support.

These materials may be placed or affixed in between a heat source and a heat sink or heat spreader, such as between an integrated circuit package and a finned heat exchanger, to improve the transfer of heat from the heat source to the heat sink or spreader.

CNT arrays or sheets of this type exhibit both high thermal conductance and mechanical durability. As a consequence, these arrays are well suited for applications where repeated cycling is required. For example, foils of this type can be employed as thermal interface materials during 'burn-in' testing of electrical components, such as chips. In other embodiments, the inert support is a surface of a conventional metal heat sink or spreader. This functionalized heat sink or spreader may then be abutted or adhered to a heat source, such as an integrated circuit package.

The CNT arrays or sheets described herein can be used as thermal interface materials in personal computers, server computers, memory modules, graphics chips, radar and radio-frequency (RF) devices, disc drives, displays, including light-emitting diode (LED) displays, lighting systems, automotive control units, power-electronics, solar cells, batteries, communications equipment, such as cellular phones, thermoelectric generators, and imaging equipment, including MRIs.

The CNT arrays or sheets can also be used for applications other than heat transfer. Examples include, but are not limited to, microelectronics, through-wafer vertical interconnect assemblies, and electrodes for batteries and capacitors. Currently, copper and aluminum foil are used as the backing materials for the anode and cathode in lithium ion batteries. A slurry of activated carbon and the lithium materials is pasted onto the foils. The electrical contact between the paste and the foil is a point of parasitic resistance. In addition to reduced electrical output this resistance can impede heat rejection from the device. Well adhered vertical CNT arrays placed at this interface would improve performance electrically and thermally.

The CNT foils or sheets could also be used for electromagnetic shielding. The CNTs act to effectively absorb electromagnetic irradiation as well as solar absorbing material, to enhance solar absorption in solar hot water heaters.

DETAILED DESCRIPTION OF THE INVENTION

I. Definitions

Figure 1:
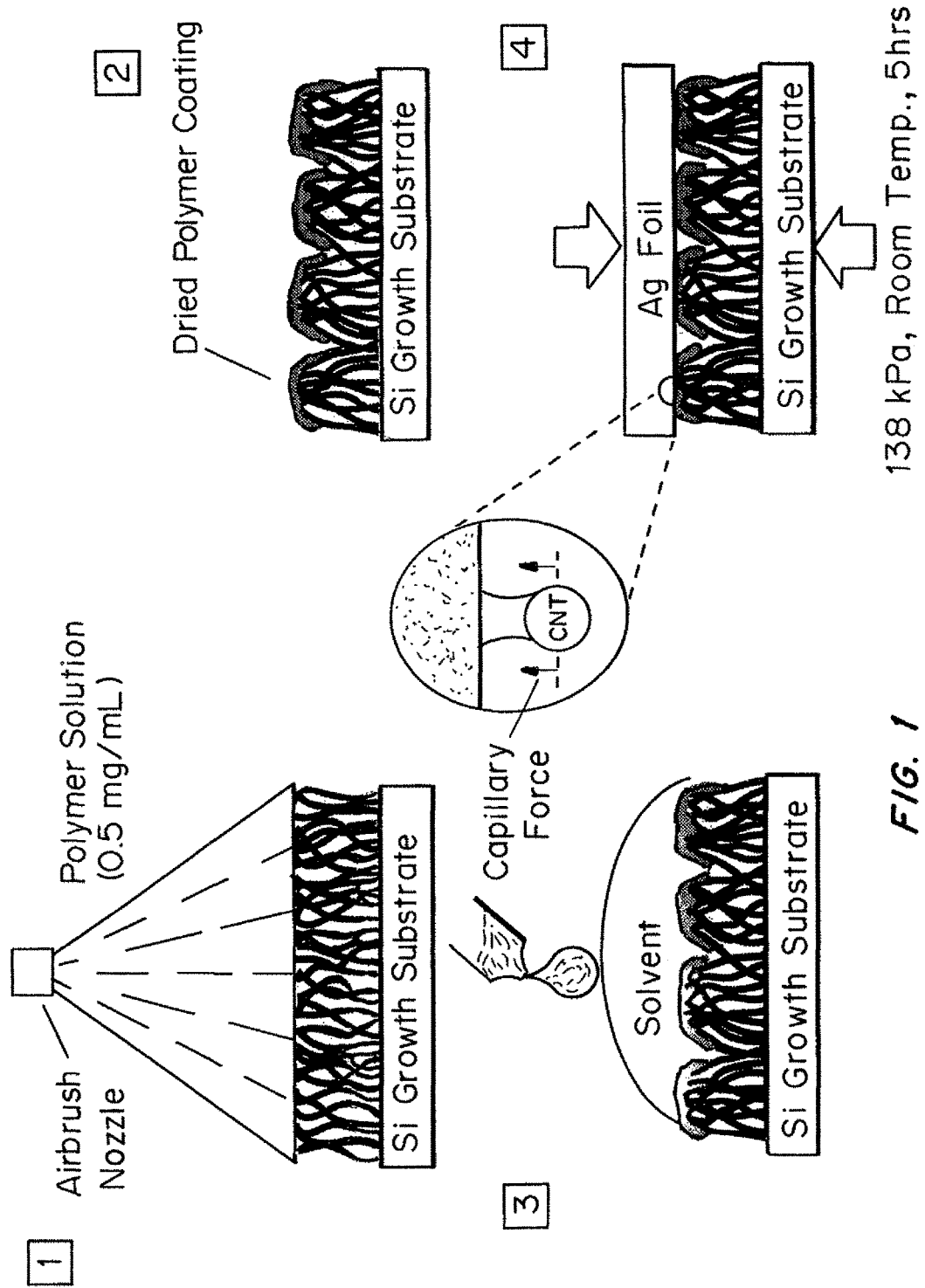
FIG. 1 is a schematic of the polymer coating and bonding process. 1. Spray deposition of polymer onto the top of CNT forest. 2 Polymer coating dries causing clumping of the CNT tips. 3 Solvent (e.g., $CHCl_3$) is applied to the top of the CNT forest to wet and reflow the polymer coating. 4 Still wet polymer coating is brought into contact a substrate and placed under pressure while the interface dries, during which time capillary forces likely draw additional CNTs towards the interface.

"Thermal Interface Material" (TIM), as used herein, refers to a material or combination of materials that provide high thermal conductance and mechanical compliance between a heat source and heat sink or spreader to effectively conduct heat away from a heat source.

"Carbon Nanotube Array" or "CNT array" or "CNT forest", as used herein, refers to a plurality of carbon nanotubes which are vertically aligned on a surface of a material. Carbon nanotubes are said to be "vertically aligned" when they are substantially perpendicular to the surface on which they are supported or attached. Nanotubes are said to be substantially perpendicular when they are oriented on average within 30, 25, 20, 15, 10, or 5 degrees of the surface normal.

"Carbon Nanotube Sheet" or "CNT sheet", as used herein, refers to a plurality of carbon nanotubes which are aligned in plane to create a free-standing sheet. Carbon nanotubes are said to be "aligned in plane" when they are substantially parallel to the surface of the sheet that they form. Nanotubes are said to be substantially parallel when they are oriented on average greater than 40, 50, 60, 70, 80, or 85 degrees from sheet surface normal.

"Polymer coating" as used herein, generally refers to polymers or molecules that bond to CNTs through van der Waals bonds, $\pi$-$\pi$ stacking, mechanical wrapping and/or covalent bonds and bond to metal, metal oxide, or semiconductor material surfaces through van der Waals bonds, $\pi$-$\pi$ stacking, and/or covalent bonds.

II. Coated Carbon Nanotube Arrays and Sheets

A. Carbon Nanotube Arrays

Coated carbon nanotube arrays are described herein. The arrays contain a plurality of carbon nanotubes supported on, or attached to, the surface of an inert substrate, such as a metallic (e.g., Al or Au) foil, silicon, or the surface of a heat sink or spreader. The CNT arrays can be formed using the methods described below. The CNTs are vertically aligned on the substrate. CNTs are said to be "vertically aligned" when they are substantially perpendicular to the surface on which they are supported or attached. Nanotubes are said to be substantially perpendicular when they are oriented on average within 30, 25, 20, 15, 10, or 5 degrees of the surface normal.

Generally, the nanotubes are present at a sufficient density such that the nanotubes are self-supporting and adopt a substantially perpendicular orientation to the surface of the multilayer substrate. Preferably, the nanotubes are spaced at optimal distances from one another and are of uniform height to minimize thermal transfer losses, thereby maximizing their collective thermal diffusivity.

The CNT arrays contain nanotubes which are continuous from the top of the array (i.e., the surface formed by the distal end of the carbon nanotubes when vertically aligned on the multilayer substrate) to bottom of the array (i.e., the surface of the multilayer substrate). The array may be formed from multi-wall carbon nanotubes (MWNTs), which generally refers to nanotubes having between approximately 4 and approximately 10 walls. The array may also be formed from few-wall nanotubes (FWNTs), which generally refers to nanotubes containing approximately 1-3 walls. FWNTs include single-wall carbon nanotubes (SWNTs), double-wall carbon nanotubes (DWNTS), and triple-wall carbon nanotubes (TWNTs). In certain embodiments, the nanotubes are MWNTs. In some embodiments, the diameter of MWNTs in the arrays ranges from 10 to 40 nm, more preferably 15 to 30 nm, most preferably about 20 nm. The length of MWNTs in the arrays can range from 1 to 5,000 micrometers, preferably 5 to 5000 micrometers, preferably 5 to 2500 micrometers, more preferably 5 to 2000 micrometers, more preferably 5 to 1000 micrometers.

The CNTs display strong adhesion to the multilayer substrate. In certain embodiments, the CNT array or sheet will remain substantially intact after being immersed in a solvent, such as ethanol, and sonicated for a period of at least five minutes. In particular embodiments, at least about 90%, 95%, 96%, 97%, 98%, 99%, or 99.9% of the CNTs remain on the surface after sonication in ethanol.

99%, or 99.9% of the CNTs remain on the surface after sonication in ethanol.

B. Carbon Nanotube Sheets

Coated carbon nanotube sheets are also described herein. The sheets contain a plurality of carbon nanotubes that support each other through strong van der Waals force interactions and mechanical entanglement to form a free-standing material. The CNT sheets can be formed using the methods described below. The CNTs form a freestanding sheet and are aligned in plane with the surface of this sheet. CNTs are said to be "aligned in plane" when they are substantially parallel to the surface of the sheet that they form. Nanotubes are said to be substantially parallel when they are oriented on average greater than 40, 50, 60, 70, 80, or 85 degrees from sheet surface normal.

Generally, the nanotubes are present at a sufficient density such that the nanotubes are self-supporting and adopt a substantially parallel orientation to the surface of the sheet. Preferably, the nanotubes are spaced at optimal distances from one another and are of uniform length to minimize thermal transfer losses, thereby maximizing their collective thermal diffusivity.

The CNT sheets may be formed from multi-wall carbon nanotubes (MWNTs), which generally refers to nanotubes having between approximately 4 and approximately 10 walls. The sheets may also be formed from few-wall nanotubes (FWNTs), which generally refers to nanotubes containing approximately 1-3 walls. FWNTs include single-wall carbon nanotubes (SWNTs), double-wall carbon nanotubes (DWNTS), and triple-wall carbon nanotubes (TWNTs). In certain embodiments, the nanotubes are MWNTs. In some embodiments, the diameter of MWNTs in the arrays ranges from 10 to 40 nm, more preferably 15 to 30 nm, most preferably about 20 nm. The length of MWNTs in the sheets can range from 1 to 5,000 micrometers, preferably 100 to 5000 micrometers, preferably 500 to 5000 micrometers, more preferably 1000 to 5000 micrometers.

C. Coating(s)

The array or sheet further contains a coating which adheres or is bonded to the CNTs. The coating can be applied as described below. In some embodiments, the coating contains one or more oligomeric materials, polymeric materials, or combinations thereof. In other embodiments, the coating contains one or more non-polymeric materials. In some embodiments, the coating can contain a mixture of oligomeric and/or polymeric material and non-polymeric materials.

A variety of materials can be coated onto the CNT arrays or sheets. In particular embodiments, the coatings cause a decrease in the thermal resistance of the array or sheet. It is preferable that the coatings are applied in liquid or powder spray form to conformally coat the tips or sidewalls of the CNTs. It is also desirable that the coating be reflowable as the interface is assembled using, for example, solvent, heat or some other easy to apply source. The polymer must be thermally stable up to 130° C. In some embodiments, the coating is readily removable, such as by heat or dissolution in a solvent, to allow for "reworking" of the interface. "Reworking", as used herein, refers to breaking the interface (i.e., removing the coating) by applying solvent or heat in order to clean the interface surface for application of a new TIM.

1. Polymeric Coating Materials

In some embodiments, the coating is, or contains, one or more polymeric materials. The polymer coating can contain a conjugated polymer, such as an aromatic, heteroaromatic, or non-aromatic polymer, or a non-conjugated polymer.

Suitable classes of conjugated polymers include polyaromatic and polyheteroaromatics including, but not limited to, polythiophenes (including alkyl-substituted polythiophenes), polystyrenes, polypyrroles, polyacetylenes, polyanilines, polyfluorenes, polyphenylenes, polypyrenes, polyazulenes, polynaphthalenes, polycarbazoles, polyindoles, polyazepines, poly(3,4-ethylenedioxythiophenes), poly(p-phenyl sulfides), and poly(p-phenylene vinylene). Suitable non-aromatic, conjugated polymers include, but are not limited to, polyacetylenes and polydiacetylenes. The polymer classes listed above include substituted polymers, wherein the polymer backbone is substituted with one or more functional groups, such as alkyl groups. In some embodiments, the polymer is polystyrene (PS). In other embodiments, the polymer is poly(3-hexythiophene) (P3HT). In other embodiments, the polymer is poly(3,4-3thylenedioxythiophene) (PEDOT) or poly(3,4-3thylenedioxythiophene) poly(styrenesulfonate) (PEDOT:PSS).

In other embodiments, the polymer is a non-conjugated polymer. Suitable non-conjugated include, but are not limited to, polyvinyl alcohols (PVA), poly(methyl methacrylates) (PMMA), polydimethylsiloxanes (PDMS), and combinations (blends) thereof. In other embodiments, the polymer is a paraffin wax. In other embodiments, the polymer is a synthetic wax such as Fischer-Tropsch waxes or polyethylene waxes. In other embodiments, the polymer is a wax that has a melting temperature above 80, 90, 100, 110, or 120° C., preferably above 130° C. In other embodiments, the polymer is a hot glue or hot melt adhesive that combines wax, tackifiers and a polymer base to provide improved surface adhesion. In other embodiments, the polymer is a pressure sensitive adhesive.

D. Other Coatings

1. Metallic Nanoparticles

The CNT arrays or sheets can additionally be coated with one or more metal nanoparticles. One or more metal nanoparticles may be adsorbed to the distal ends and/or sidewalls of the CNTs to bond the distal ends and/or sidewalls of the CNTs to a surface, reduce thermal resistance between the CNT array or sheet and a surface, or combinations thereof. Metal nanoparticles can be applied to CNT arrays or sheets using a variety of methods known in the art.

Examples of suitable metal nanoparticles include palladium, gold, silver, titanium, iron, nickel, copper, and combinations thereof.

2. Flowable or Phase Change Materials

In certain embodiments, flowable or phase change materials are additionally applied to the CNT array or sheet. Flowable or phase change materials may be added to the CNT array or sheet to displace the air between CNTs and improve contact between the distal ends and/or sidewalls of CNTs and a surface, and as a result reduce thermal resistance of the array or sheet and the contact between the array or sheet and a surface, or combinations thereof. Flowable or phase change materials can be applied to CNT arrays using a variety of methods known in the art.

Examples of suitable flowable or phase change materials include paraffin waxes, polyethylene waxes, hydrocarbon-based waxes in general, and blends thereof. Other examples of suitable flowable or phase change materials that are neither wax nor polymeric include liquid metals, oils, organic-inorganic and inorganic-inorganic eutectics, and blends thereof. In some embodiments, the coating material, such as a non-polymeric coating material and the flowable or phase change material are the same material or materials.

The coated CNTs can be abutted or bonded to a thermally conducting top substrate to prepare a device for evaluating thermal resistance or a heat source, such as an integrated circuit package, to form a commercial product.

E. Reduction in Thermal Resistance

The coated CNT arrays or sheets described herein exhibit reduced thermal resistance compared to uncoated arrays or sheets. The total thermal resistance of the interface, which is the sum of the contact resistance of the polymer bonded interface, the resistance of the CNT forest or sheet, and the contact resistance at the growth substrate interface, can be measured using a variety techniques in the art, such as the photoacoustic (PA) method.

In one embodiment, the thermal resistance of the coated CNT array or sheet is reduced by at least about 25%, 30%, 35%, 40%, 45%, 50%, 55%, 60%, 65%, 70% or greater compared to uncoated CNT arrays or sheets when measured using the photoacoustic method described in Example 1. This reduction is observed for one-sided and two-sided arrays and for sheets coated on one or both side. In other embodiments, the coated arrays exhibit thermal resistances less than about 5.0, 4.5, 4.0, 3.5, 3.0, 2.5, 2.0, 1.5 $mm^2K/W$. In some embodiments, the thermal resistance is about 2, preferably about 1 $mm^2K/W$.

The height of the CNT forest and the quantity of polymer sprayed can be individually varied to understand their influence on the thermal resistance of the interface.

Two polymer systems are described in the examples. The first, polystyrene (PS), was selected because it is a low-cost widely-used aromatic polymer that is chemically stable at device operating temperatures. The second, poly 3-hexylthiophene (P3HT), was selected because it has been shown to interact strongly with CNTs through $\pi$-$\pi$ bonding and by preferentially wrapping around the nanotube axis. Additionally, due to its conjugated back bone, P3HT is chemically stable at higher temperatures compared to PS. Bonding with both P3HT and PS reduced the thermal resistance of the interface with the largest reductions occurring at the tallest forest heights. For example, a 58% reduction was observed for PS bonding of forests 115 µm in height.

Thermal degradation, due to chemical stability of the polymer coatings at elevated temperatures, can be a concern for polymer-based TIMs. As such, four of the samples, two P3HT bonded and two PS bonded, were subsequently thermally baked at 130° C. and 680 mbar for 110 hours in a vacuum oven to mimic high temperature operating conditions. There was no statistically significant change in the thermal resistance of the samples before and after baking for three of the four sample types tested.

The overall results from thermal baking suggest that the polymer coatings used here are stable over the studied temperature range and that the process may be suitable for integration with high-power density devices. "Stable", as used herein, generally means that the coated arrays, after baking at 130° C. and 680 mbar for 110 hours in a vacuum oven, exhibit a thermal resistance that is within 5%, 10%, 15%, 20%, 25%, 30% of the thermal resistance of the coated array or sheet prior to baking.

The thermal resistances of bare CNT-coated foil interposers in a dry contact arrangement were measured to be 21±4 mm2-K/W. The thermal resistances of interposers spray coated and bonded with 1 spray of P3HT were measured to be 9±2 mm$^2$-K/W; an approximate twofold decrease in resistance. Spray coating with polystyrene and poly 3-hexylthiophene produced CNT TIMs with thermal resistances of 8.5±0.5 and 4.9±0.3 mm$^2$-K/W respectively, comparable to conventional solder TIMs. Adding polymer does not reduce the area normalized thermal resistance of CNT contacts, but instead extends the area available for heat transfer at the contacts to CNT tips.

The coated CNT arrays also exhibited increased shear attachment strength compared to uncoated arrays. In some embodiments, the coated CNT arrays exhibit at least 1.5, 2.0, 2.5, or 3.0-fold or greater increase in the shear attachment strength to glass to uncoated arrays when bonded to glass slides. For example, CNT forests that were polymer bonded to glass slides coated with Ag exhibited average attachment strengths of 290 kPa. This is a more than threefold increase over reported values for shear attachment strength of CNTs in dry contact with glass slides. The increase in attachment strength from polymer bonding corresponds to an increase in area that is similar in magnitude to the increase in area that would be achieved from filling the space between the CNT and Ag with polymer. This suggests that adding the polymer might increase the contact area in this manner. Furthermore, the estimated real contact area in CNT forest TIMs is only ~1% of the apparent area. Similarly, it has been estimated in the literature that only 0.35% of the volume fraction of CNT forests effectively participate in heat transfer in CNT forest TIMs. Therefore, the presence of the polymer may increase the contact area by engaging additional CNTs, especially since capillary forces associated with drying of solvent during the bonding process likely draw additional CNT tips closer to the interface.

Polymer coating and bonding was demonstrated as an effective means for increasing the contact area and reducing the thermal resistance of CNT forest thermal interfaces. The bonding process added nanoscale coatings of polymer around individual CNT contacts and ostensibly pulled, through capillary action, additional CNTs close to the interface to increase contact area. The thermal resistances did not change significantly after baking at 130° C. for 110 hrs.

III. Methods for Preparing Coated Carbon Nanotube Arrays and Sheets

A. Carbon Nanotube Arrays

Carbon nanotube arrays can be prepared using techniques well known in the art. In one embodiment, the arrays are prepared as described in U.S. Ser. No. 13/356,827. This method involves the use of multilayer substrates to promote the growth of dense vertically aligned CNT arrays and provide excellent adhesion between the CNTs and metal surfaces.

The multilayer substrates contain three or more layers deposited on an inert support, such as a metal surface. Generally, the multilayer substrate contains an adhesion layer, an interface layer, and a catalytic layer, deposited on the surface of an inert support. Generally, the support is formed at least in part from a metal, such as aluminum, platinum, gold, nickel, iron, tin, lead, silver, titanium, indium, copper, or combinations thereof. In certain instances, the support is a metallic foil, such as aluminum or copper foil. The support may also be a surface of a device, such as a conventional heat sink or heat spreader used in heat exchange applications.

The adhesion layer is formed of a material that improves the adhesion of the interface layer to the support. In certain embodiments, the adhesion layer is a thin film of iron. Generally, the adhesion layer must be thick enough to remain a continuous film at the elevated temperatures used to form CNTs. The adhesion layer also generally provides resistance to oxide and carbide formation during CNT synthesis at elevated temperatures.

The interface layer is preferably formed from a metal which is oxidized under conditions of nanotube synthesis or during exposure to air after nanotube synthesis to form a suitable metal oxide. Examples of suitable materials include aluminum. Alternatively, the interface layer may be formed from a metal oxide, such as aluminum oxide or silicon oxide. Generally, the interface layer is thin enough to allow the catalytic layer and the adhesion layer to diffuse across it. In some embodiments wherein the catalytic layer and the adhesion layer have the same composition, this reduces migration of the catalyst into the interface layer, improving the lifetime of the catalyst during nanotube growth.

The catalytic layer is typically a thin film formed from a transition metal that can catalyze the formation of carbon nanotubes via chemical vapor deposition. Examples of suitable materials that can be used to form the catalytic layer include iron, nickel, cobalt, rhodium, palladium, and combinations thereof. In some embodiments, the catalytic layer is formed of iron. The catalytic layer is of appropriate thickness to form catalytic nanoparticles or aggregates under the annealing conditions used during nanotube formation.

In other embodiments, the multilayer substrate serves as catalytic surface for the growth of a CNT array. In these instances, the process of CNT growth using chemical vapor deposition alters the morphology of the multilayer substrate. Specifically, upon heating, the interface layer is converted to a metal oxide, and forms a layer or partial layer of metal oxide nanoparticles or aggregates deposited on the adhesion layer. The catalytic layer similarly forms a series of catalytic nanoparticles or aggregates deposited on the metal oxide nanoparticles or aggregates. During CNT growth, CNTs form from the catalytic nanoparticles or aggregates. The resulting CNT arrays contain CNTs anchored to an inert support via an adhesion layer, metal oxide nanoparticles or aggregates, and/or catalytic nanoparticles or aggregates.

In particular embodiments, the multilayer substrate is formed from an iron adhesion layer of about 30 nm in thickness, an aluminum or alumina interface layer of about 10 nm in thickness, and an iron catalytic layer of about 3 nm in thickness deposited on a metal surface. In this embodiment, the iron adhesion layer adheres to both the metal surface and the Al (alumina nanoparticles or aggregates after growth) or $Al_2O_3$ interface layer. The iron catalytic layer forms iron nanoparticles or aggregates from which CNTs grow. These iron nanoparticles or aggregates are also bound to the alumina below.

As a result, well bonded interfaces exist on both sides of the oxide interface materials. Of metal/metal oxide interfaces, the iron-alumina interface is known to be one of the strongest in terms of bonding and chemical interaction. Further, metals (e.g., the iron adhesion layer and the metal surface) tend to bond well to each other because of strong electronic coupling. As a consequence, the CNTs are strongly anchored to the metal surface.

Further, subsurface diffusion of iron from the catalytic layer during nanotube growth is reduced because the same metal is on both sides of the oxide support, which balances the concentration gradients that would normally drive diffusion. Therefore, catalyst is not depleted during growth, improving the growth rate, density, and yield of nanotubes in the array.

In some embodiments, the CNT array is formed by vertically aligning a plurality of CNTs on the multilayer substrate described above. This can be accomplished, for example, by transferring an array of CNTs to the distal ends of CNTs grown on the multilayer substrate. In some embodiments, tall CNT arrays are transferred to the distal ends of very short CNTs on the multilayer substrate. This technique improves the bond strength by increasing the surface area for bonding.

The inert support for the CNT array or sheet can be a piece of metal foil, such as aluminum foil. In these cases, CNTs are anchored to a surface of the metal foil via an adhesion layer, metal oxide nanoparticles or aggregates, and catalytic nanoparticles or aggregates. In some instances only one surface (i.e., side) of the metal foil contains an array or sheet of aligned CNTs anchored to the surface. In other cases, both surfaces (i.e., sides) of the metal foil contain an array or sheet of aligned CNTs anchored to the surface. In other embodiments, the inert support for the CNT array or sheet is a surface of a conventional metal heat sink or heat spreader. In these cases, CNTs are anchored to a surface of the heat sink or heat spreader via an adhesion layer, metal oxide nanoparticles or aggregates, and catalytic nanoparticles or aggregates. This functionalized heat sink or heat spreader may then be abutted or adhered to a heat source, such as an integrated circuit package.

B. Carbon Nanotube Sheets

Carbon nanotube sheets can be prepared using techniques well known in the art. In one embodiment, the sheets are prepared as described in U.S. Pat. No. 7,993,620 B2. In this embodiment, CNT agglomerates are collected into sheets in-situ inside the growth chamber on metal foil substrates. The sheets can then be densified by removing the solvent. In another embodiment, the CNT sheets are made by vacuum filtration of CNT agglomerates that are dispersed in a solvent.

C. Coated Nanotube Arrays and Sheets

1. Polymer Coatings

Polymers to be coated can be dissolved in one or more solvents and spray coated or chemically or electrochemically deposited onto the top of vertical CNT forests or arrays grown on a substrate, or on a sheet, as described above. The coating materials can also be spray coated in powder form onto the top of vertical CNT forests or arrays grown on a substrate, or on CNT sheets as described above. The coatings includes polymers or molecules that bond to CNTs through van der Waals bonds, π-π stacking, mechanical wrapping and/or covalent bonds and bond to metal, metal oxide, or semiconductor material surfaces through van der Waals bonds, π-π stacking, and/or covalent bonds.

For spray coating, coating solutions can be prepared by sonicating or stirring the coating materials for a suitable amount of time in an appropriate solvent. The solvent is typically an organic solvent or solvent and should be a solvent that is easily removed, for example by evaporation at room temperature or elevated temperature. Suitable solvents include, but are not limited to, chloroform. The polymer can also be spray coated in dry form using powders with micron scale particle sizes, i.e., particles with diameters less than 100, 50, 40, 20, 10 micrometers. In this embodiment, the polymer powder would need to be soaked with solvent or heated into a liquid melt to spread the powder particles into a more continuous coating after they are spray deposited.

The thickness of the polymer coatings is generally between 1 and 1000 nm, preferably between 1 and 500 nm, more preferably between 1 and 100 nm, most preferably between 1 and 50 nm. In some embodiments, the coating thickness is less than 500, 450, 400, 350, 300, 250, 200, 150, 100, 90, 80, 70, 60, 50, 40, 30, 20 or 10 nm.

Spray coating process restricts the deposition of coating to the CNT tips and limits clumping due to capillary forces associated with the drying of the solvent. The amount of coating visible on the CNT arrays increases with the number of sprays. No morphological differences were observable between PS and P3HT as shown in the examples. Alternative techniques can be used to spray coat the coating materials onto the CNT arrays including techniques more suitable for coating on a commercial scale.

To demonstrate how the spray coating process might be scaled for manufactured production, CNT forests were grown on both sides of Al foil to create a thermal interposer. The CNT-coated foil interposer eliminates the necessity to grow or transfer print CNTs directly onto the backside of the chip or packaging. The CNT growth and spray coating process can instead take place separately on the metal foil, before being incorporated into the electronic package.

In another embodiment that demonstrates how the polymer coating process might be scaled, CNT sheets are dipped into coating solutions or melted coatings to coat CNTs throughout the thickness of the sheets, increasing the thermal conductivity of the sheet in the cross-plane direction by greater than 20, 30, 50, or 70%. These coated sheets are then placed between a chip and heat sink or heat spreader with the application of solvent or heat to reflow the polymer and bond the CNT sheet between the chip and heat sink or spreader to reduce the thermal resistance between the chip and heat sink or heat spreader.

In other embodiments, the coating material can be deposited on the CNT array or sheet using deposition techniques known in the art, such as chemical deposition (e.g., chemical vapor deposition (CVD)), aerosol spray deposition, and electrochemical deposition.

In one embodiment, the polymer is applied by electrochemical deposition. In electrochemical deposition, the monomer of the polymer is dissolved in electrolyte and the CNT array or sheet is used as the working electrode, which is opposite the counter electrode. A potential is applied between the working and counter electrode with respect to a third reference electrode. The monomer is electrooxidized on the CNT array tips or sheet sidewalls that face the electrolyte as a result of the applied potential. Controlling the total time in which the potential is applied controls the thickness of the deposited polymer layer.

In the examples below, the solutions were sprayed in 1 mL increments onto the CNT tips using an airbrush (Iwata Eclipse HP-CS Gravity Feed) with 280 kPa $N_2$ as the carrier gas. The airbrush was positioned 10 cm above the CNT forest so that the conical spray profile of the airbrush deposited polymer over an area slightly larger than the area of the CNT forest sample. It is difficult to quantify the fraction of polymer deposited onto the CNT forest for each 1 mL spray; therefore the quantity of polymer applied to each CNT forest is described in terms of the number of 1 mL sprays. The number of sprays was altered between 1, 2, and 5 in order to examine the effects of the quantity of polymer on the resultant thermal resistance of the bonded CNTs.

Coated CNTs are typically bonded to a substrate, such as a metal (e.g., gold or aluminum foil) by wetting the interface with solvent, and allowing it to dry under moderate pressure at room temperature. For example, coated CNTs on Si substrates can be bonded to metallic foils, such as Ag foil (e.g. 1×1 cm square, 25 μm thick). The Ag foil acts as a thermally conductive top substrate for photoacoustic measurements. Before bonding, a metallic layer (e.g. 80 nm of Ti) can be evaporated onto the topside of the metallic foil for absorbing the laser energy (λ=1100 nm). To bond the polymer coated CNT forests to the metallic foil, the CNT forests were first wet with a few droplets of solvent (e.g., $CHCl_3$) to reflow the coating, and then promptly placed into contact with the foil under pressure. The interface was allowed to dry, typically for several (e.g., 5) hours at ambient conditions before the load was removed.

In some embodiments, the coating material is, or contains, one or more oligomeric and/or polymeric materials. In particular embodiments, the polymer can be a conjugated polymer, including aromatic and non-aromatic conjugated polymers. Suitable classes of conjugated polymers include polyaromatic and polyheteroaromatics including, but not limited to, polythiophenes (including alkyl-substituted polythiophenes), polystyrenes, polypyrroles, polyacetylenes, polyanilines, polyfluorenes, polyphenylenes, polypyrenes, polyazulenes, polynaphthalenes, polycarbazoles, polyindoles, polyazepines, poly(3,4-ethylenedioxythiophenes), poly(p-phenyl sulfides), and poly(p-phenylene vinylene). Suitable non-aromatic polymers include, but are not limited to, polyacetylenes and polydiacetylenes. The polymer classes listed above include substituted polymers, wherein the polymer backbone is substituted with one or more functional groups, such as alkyl groups. In some embodiments, the polymer is polystyrene (PS). In other embodiments, the polymer is poly(3-hexythiophene) (P3HT).

In other embodiments, the polymer is a non-conjugated polymer. Suitable non-conjugated include, but are not limited to, polyvinyl alcohols (PVA), poly(methyl methacrylates) (PMMA), polydimethylsiloxanes (PDMS), and combinations (blends) thereof. In other embodiments, the polymer is a paraffin wax. In other embodiments, the polymer is a synthetic wax such as Fischer-Tropsch waxes or polyethylene waxes. In other embodiments, the polymer is a wax that has a melting temperature above 80, 90, 100, 110, and 120° C., preferably above 130° C. In other embodiments, the polymer is a hot glue or hot melt adhesive that combines wax, tackifiers and a polymer base to provide improved surface adhesion. In other embodiments, the polymer is a pressure sensitive adhesive.

Transmission electron micrographs (TEMs) taken of CNTs coated/bonded with P3HT showed P3HT chains wrapped around individual CNTs. This agrees with prior observations of strong interaction between CNTs and P3HT. In a process similar to that described above, both sides of the CNT-coated foil interposer structures were bonded between quartz substrates and Ag foil. However, the bonding pressure was increased to 580 kPa to observe the maximum potential of the structure.

2. Metallic Nanoparticles

The CNT arrays or sheets can additionally be coated with one or more metal nanoparticles. One or more metal nanoparticles may be adsorbed to the distal ends and/or sidewalls of the CNTs to bond the distal ends of the CNTs to a surface, reduce thermal resistance between the CNT array or sheet and a surface, or combinations thereof. Metal nanoparticles can be applied to CNT arrays or sheets using a variety of methods known in the art. For example, a solution of metal thiolate such as palladium hexadecanethiolate can be sprayed or spin coated onto the distal ends and/or sidewalls of the CNTs, and the organics can be baked off to leave palladium nanoparticles. In another example, electron-beam or sputter deposition can be used to coat metal nanoparticles or connected "film-like" assemblies of nanoparticles onto the distal ends and/or sidewalls of the CNTs. The metallic particles can be coated simultaneously with the coating or before or after coating.

Examples of suitable metal nanoparticles include palladium, gold, silver, titanium, iron, nickel, copper, and combinations thereof.

3. Flowable or Phase Change Materials

In certain embodiments, flowable or phase change materials are additionally applied to the CNT array or sheet. Flowable or phase change materials may be added to the CNT array or sheet to displace the air between CNTs and improve contact between the distal ends of CNTs and a surface, and as a result reduce thermal resistance of the array or sheet and the contact between the array or sheet and a surface, or combinations thereof. Flowable or phase change materials can be applied to CNT arrays or sheets using a variety of methods known in the art. For example, flowable or phase change materials in their liquid state can be wicked into a CNT array or sheet by placing the array or sheet in partial or full contact with the liquid.

Examples of suitable flowable or phase change materials include paraffin waxes, polyethylene waxes, hydrocarbon-based waxes in general, and blends thereof. Other examples of suitable flowable or phase change materials that are neither wax nor polymeric include liquid metals, oils, organic-inorganic and inorganic-inorganic eutectics, and blends thereof. In some embodiments, the coating material(s) and the flowable or phase change material are the same.

IV. Applications

The coated CNT arrays or sheets described herein can be used as thermal interface materials. The CNT arrays or sheets can be formed and/or deposited, as required for a particular application.

For example, in one embodiment, the inert support for the coated CNT arrays is a piece of metal foil, such as aluminum foil. In some instances only one surface (i.e., side) of the metal foil contains a coated array of aligned CNTs anchored to the surface. In other cases, both surfaces (i.e., sides) of the metal foil contain a coated array of aligned CNTs anchored to the surface. If desired, one or more metal particles, flowable or phase change materials, or combinations thereof can additionally be coated on to the polymer-coated CNT array or sheet.

These materials may be placed or affixed in between a heat source and a heat sink or heat spreader, such as between an integrated circuit package and a finned heat exchanger, to improve the transfer of heat from the heat source to the heat sink or spreader.

CNT arrays of this type exhibit both high thermal conductance and mechanical durability. As a consequence, these arrays are well suited for applications where repeated cycling is required. For example, foils of this type can be employed as thermal interface materials during 'burn-in' testing of electrical components, such as chips.

In other embodiments, the inert support is a surface of a conventional metal heat sink or spreader. This functionalized heat sink or spreader may then be abutted or adhered to a heat source, such as an integrated circuit package.

The CNT arrays or sheets described herein can be used as thermal interface materials in personal computers, server computers, memory modules, graphics chips, radar and radio-frequency (RF) devices, disc drives, displays, including light-emitting diode (LED) displays, lighting systems, automotive control units, power-electronics, solar cells, batteries, communications equipment, such as cellular phones, thermoelectric generators, and imaging equipment, including MRIs.

The CNT arrays or sheets can also be used for applications other than heat transfer. Examples include, but are not limited to, microelectronics, through-wafer vertical interconnect assemblies, and electrodes for batteries and capacitors. Currently, copper and aluminum foil are used as the backing materials for the anode and cathode in lithium ion batteries. A slurry of activated carbon and the lithium materials is pasted onto the foils. The electrical contact between the paste and the foil is a point of parasitic resistance. In addition to reduced electrical output this resistance can impede heat rejection from the device. Well adhered vertical CNT arrays placed at this interface would improve performance electrically and thermally.

The CNT foils or sheets can also be used for electromagnetic shielding. The CNTs act to effectively absorb electromagnetic irradiation as well as solar absorbing material, to enhance solar absorption in solar hot water heaters.

EXAMPLES

Example 1

Preparation and Coating of Carbon Nanotube Arrays

Preparation of Carbon Nanotube Arrays

Vertical forests of carbon nanotubes (CNTs) were grown on single crystal Si substrates cut into 1×1 cm squares. Ti, Al, Fe films in thicknesses of 30, 10, 3 nm, respectively, were evaporated onto the Si as support and catalyst layers for CNT growth. Afterwards the CNTs were grown using a low-pressure chemical vapor deposition process at 850° C. and 10 mbar in an Aixtron Black Magic© reactor with $C_2H_2$ as the carbon source gas. The growth time was varied from 3-15 min to grow forests of multiwall CNTs ranging from 5-150 nm in height with an average CNT diameter of 8 nm.

CNT forests were also grown on both sides of 10 nm thick Al foil (Alfa Aesar 41798) to create a thermal interposer. An identical growth process was employed except 100 nm of Ni was added to the bottom of the catalyst stack as a diffusion barrier and the temperature of the growth stage was lowered to 750° C. (a pyrometer measured the actual sample temperature to be approximately 630° C., which is less than the melting temperature of Al).

Coating of Carbon Nanotube Arrays

For spray coating polymer solutions, 0.5 mg/mL of poly (3-hexylthiophene) (P3HT, regioregular Sigma Aldrich 445703) or polystyrene (PS, MW 35,000 Sigma Aldrich 331651), were prepared by sonicating or stirring for 5 min in $CHCl_3$. The solutions were sprayed in 1 mL increments onto the CNT tips using an airbrush (Iwata Eclipse HP-CS Gravity Feed) with 280 kPa $N_2$ as the carrier gas. The airbrush was positioned 10 cm above the CNT forest so that the conical spray profile of the airbrush deposited polymer over an area slightly larger than the area of the CNT forest sample. It is difficult to quantify the fraction of polymer deposited onto the CNT forest for each 1 mL spray; therefore we refer to quantity of polymer applied to each CNT forest in terms of the number of 1 mL sprays. The number of sprays was altered between 1, 2, and 5 in order to examine the effects of the quantity of polymer on the resultant thermal resistance of the bonded CNTs. The spray coating process restricts the deposition of polymer to the CNT tips and limits clumping due to capillary forces associated with the drying of the solvent.

The amount of polymer visible on the CNT arrays increases with the number of sprays. No morphological differences were observable between PS and P3HT.

Characterization of Coated Nanotube Arrays

Spray coated CNTs on Si substrates were bonded to 1×1 cm square pieces of 25 µm thick Ag foil (Alfa Aesar 11498). The Ag foil acts as a thermally conductive top substrate for photoacoustic measurements. Before bonding, 80 nm of Ti was evaporated onto the topside of the Ag foil for absorbing the laser energy (λ=1100 nm). To bond the polymer coated CNT forests to the Ag foil, the CNT forests were first wet with a few droplets of $CHCl_3$ to reflow the polymer, and then promptly placed into contact with the Ag foil under 138 kPa of pressure. The interface was allowed to dry for at least 5 hours at ambient conditions before the load was removed. The entire spray coating and bonding process is shown schematically in FIG. 1. Transmission electron micrographs (TEMs) taken of CNTs after bonding captured P3HT chains wrapped around individual CNTs. This agrees with prior observations of strong interaction between CNTs and P3HT 19-21. In a process similar to that described above, both sides of the CNT-coated foil interposer structures were bonded between quartz substrates and Ag foil. However, the bonding pressure was increased to 580 kPa to observe the maximum potential of the structure.

Measurement of Thermal Resistance of Coat Carbon Nanotube Arrays

Figure 2:
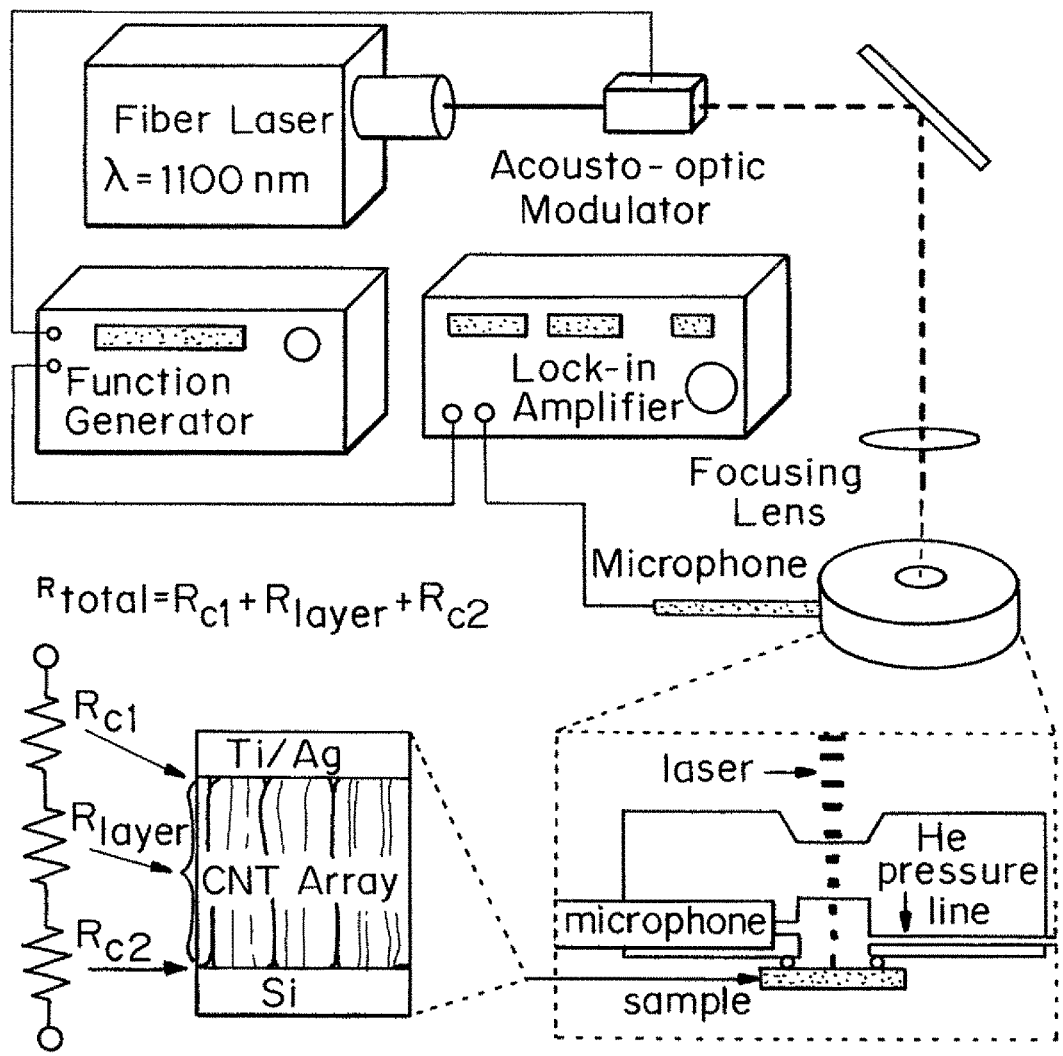
FIG. 2 is a schematic of the photoacoustic system and sample configuration. The thermal resistance reported is the total resistance of the CNT interface.
Figure 3A:
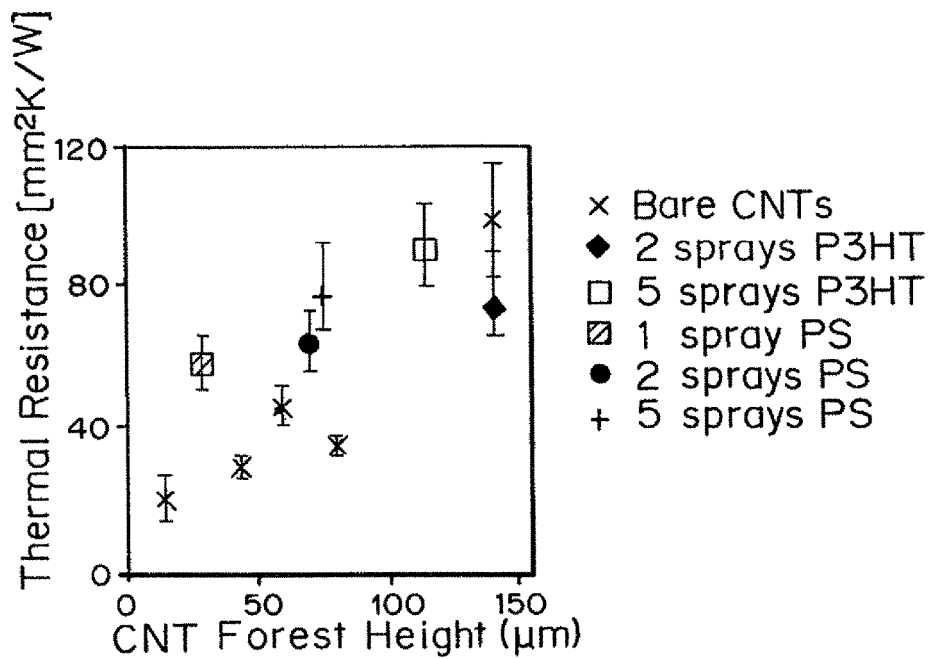
FIGS. 3A-D are graphs showing thermal resistance ($mm^2K/W$) as a function of carbon nanotube (CNT) forest height (in microns) for: polymer coated and bare CNT arrays in dry contact (FIG. 3A); polystyrene (PS) bonded interfaces (PA cell pressure=7 kPa) compared to the dry contact interfaces (PA cell pressure=138 kPa) (FIG. 3B); poly(3-hexylthiophene) (P3HT) bonded interfaces (PA cell pressure=7 kPa) compared to dry contact interfaces (PA cell pressure=138 kPa) (FIG. 3C); and polymer bonded samples before and after being baked at 130° C. for 110 hr (FIG. 3D).
Figure 3B:
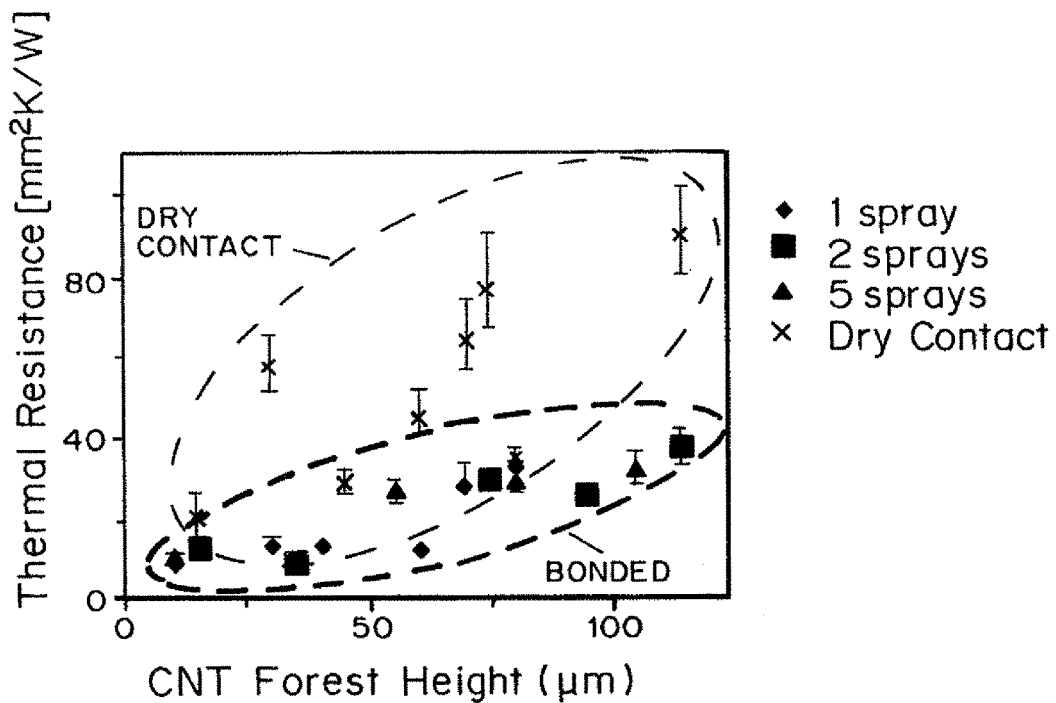
Figure 3C:
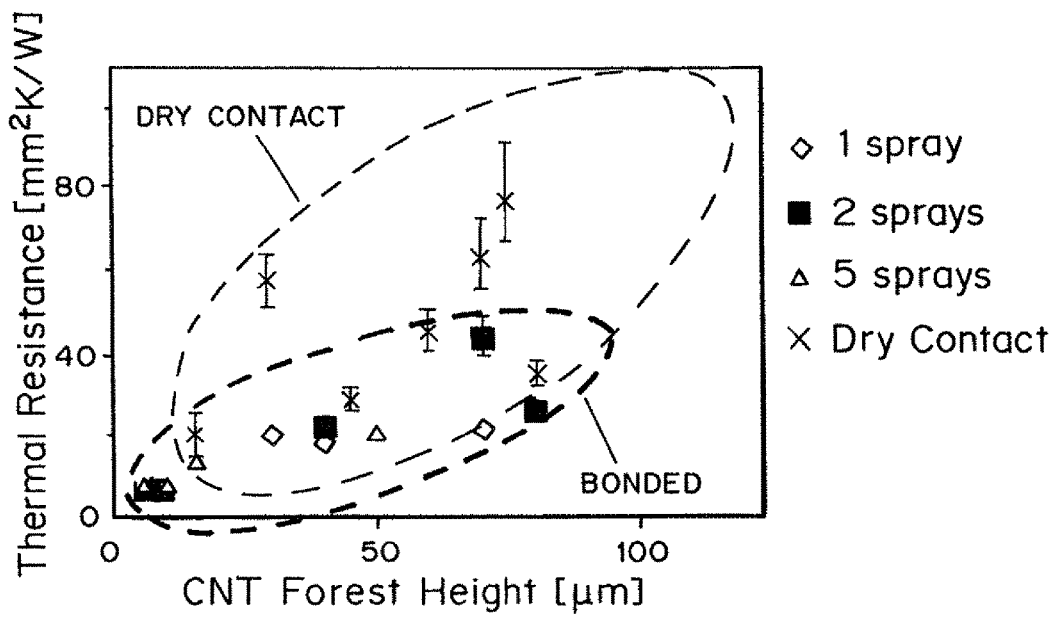
Figure 3D:
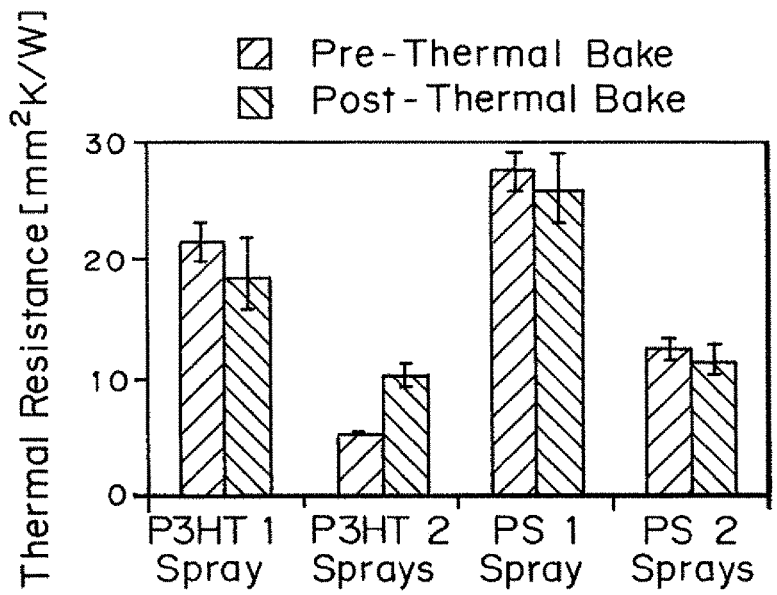

The thermal resistance of the polymer bonded structures was measured using a photoacoustic (PA) method, shown in FIG. 2. The PA method uses a modulated laser beam to periodically heat the sample structure. As the heat is absorbed at the sample surface, it is conducted both downward through the sample as well as upward into a He gas-filled acoustic chamber. The periodic nature of the heating causes periodic pressure fluctuations in the He gas layer that are detected using a microphone embedded in the chamber wall. The phase delay of the pressure signal relative to the heating pulse is used to fit unknown thermal properties in a theoretical model for 1D heat conduction through layered media.

In addition to bonded interfaces, two other sample configurations were measured in an effort to better understand the effects of the polymer on the interface resistance; dry contact: as grown bare CNT forests in dry contact with the Ag foil, and polymer coated dry contact: CNT forests spray coated with varying quantities of polymer that were allowed to dry before being placed into dry contact with the Ag foil.

The total thermal resistance for all three sample configurations (dry contact, polymer coated dry contact, and polymer bonded) is shown in FIGS. 3 A, B, and C. Each of these total resistances is the sum of the contact resistance at the CNT tips, the intrinsic thermal resistance of the CNT forest, and the contact resistance at the CNT growth substrate. It is important to note that the base pressure of the He gas in the PA cell can be adjusted to alter the pressure applied to the interface during the measurement. Measurements for all three sample configurations were conducted at cell pressures of both 7 and 138 kPa.

All results for the dry contact sample configurations shown in FIG. 3 A, B, and C are those collected at a cell pressure of 138 kPa. Data collected on dry contact and polymer coated dry contact samples at 7 kPa were inconsistent, likely due to inconsistent and/or poor contact conditions at the interface under this light load. The data collected on bonded samples did not exhibit significant changes with the pressure in the PA cell, indicative of a well-bonded interface, and is shown at 7 kPa in FIGS. 3 B and C. All of the data from FIG. 3 A for samples less than 125 µm in height are shown in FIGS. 3 B and C for comparison. These data are labeled as "Dry Contact," although the set includes both the dry contact and the polymer coated dry contact data.

The thermal resistance increases with CNT height for all sample configurations. The thermal resistance of polymer coated dry contact samples was higher than all but one of the bare CNT dry contact samples. Because the nanoscale polymer coating has relatively negligible thermal resistance, the difference in performance likely stems from the fact that adding the dried coating of polymer to the interface stiffens the top of the forest, effectively reducing the extent to which it conforms to the Ag foil. This reduces the contact area and increases the thermal contact resistance. Bonding with both P3HT and PS reduced the thermal resistance of the interface with the largest reductions occurring at the tallest forest heights. For example, a 58% reduction was observed for PS bonding of forests 115 µm in height. The polymer bonded samples exhibited a weak trend of increased thermal resistance with the number of sprays. However, the trend is considered to be of low significance because it is violated for several samples, and because the magnitude of the differences in resistance with number of sprays is of similar order to the distribution of the data. The lowest measured resistances for P3HT-bonded, PS-bonded, and bare CNT dry contact samples were 4.9±0.3 mm2-K/W (10 µm tall forest with 2 sprays), 8.5±0.5 mm2-K/W (10 µm tall forest with 1 spray), 20±6 mm2-K/W (15 µm tall forest), respectively.

The reported PA measurement uncertainties have contributions from both the resolution of the experimental setup, estimated to be ±1 degrees in the measured phase shift, and from repeatability, i.e. variations in the thermal resistance at different measurement locations on a sample. The error bars include contributions from both sources for the dry contact and polymer coated dry contact data. The error bars represent only the resolution of the measurement technique for bonded samples and are too small to be seen for the majority of the data points. The uncertainty associated with repeatability is captured by the distribution of the data for bonded samples.

Figure 4A:
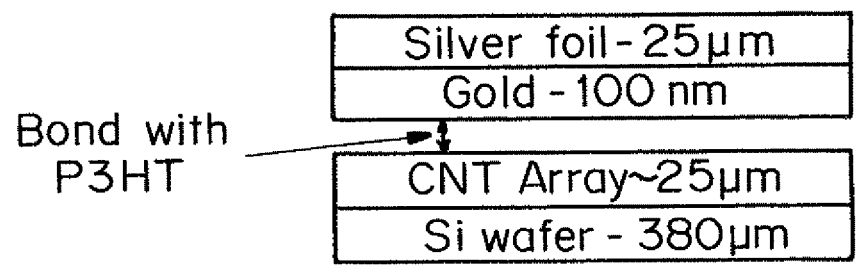
FIG. 4A is a schematic of a single-sided coated carbon nanotube array device.
Figure 4B:
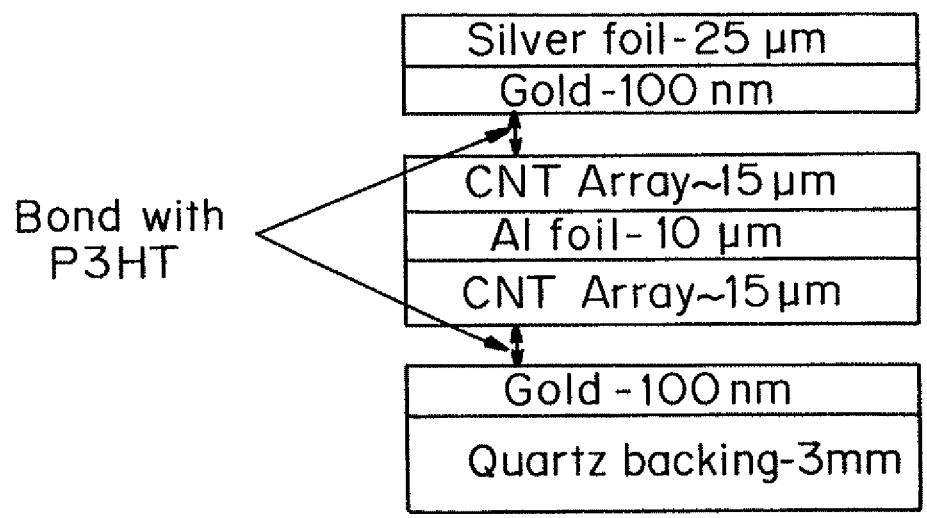
FIG. 4B is a schematic of a double-sided coated carbon nanotube array device.

Table 1 shows the reduction in thermal resistance for unbonded and polymer-bonded for single-sided and double-sided arrays. Schematics of single-sided and double-sides arrays are shown in FIGS. 4A and 4B.

TABLE 1

Reduction of Thermal Resistance Due to Polymer Bonding

| | Thermal Resistance, mm$^2$K/W | | Reduction, |
|---|---|---|---|
| | Unbonded | Polymer-bonded | % |
| Single-Sided | 13.1 | 4.0 | 70% |
| Double-Sided | 21.8 | 6.5 | 70% |

It is interesting to note that the same reduction of resistance was observed for both the single and double-side CNT structures. Given that the majority of the resistance of the sample is found in the CNT contacts, it follows that applying the same bonding process would cause a similar reduction in both cases.

TEM analysis (JEOL 4000EX) was conducted on several polymer bonded samples after undergoing photoacoustic (PA) characterization to observe the CNT-polymer interaction. Samples were prepared by peeling away the Ag foil to expose the CNT forest, and then scraping the exposed forest off the Si substrate and into dimethylformamide (DMF). Neither PS nor P3HT were observed to be soluble in DMF. The solutions were sonicated for roughly one hour to disperse the CNTs before being dropcast onto a carbon TEM grid and allowed to dry for several hours. For CNT forests that had been bonded with P3HT, polymer chains were observed to wrap around the CNT, demonstrating that spray coating and bonding process enabled the formation strong interactions between the P3HT and CNTs.

Effect of Thermal Degradation of the Coating on Thermal Resistance

Thermal degradation, due to chemical stability of the polymers at elevated temperatures, is also a significant concern for polymer based TIMs. As such, four of the samples, two P3HT bonded and two PS bonded, were subsequently thermally baked at 130° C. and 680 mbar for 110 hours in a vacuum oven to mimic high temperature operating conditions. There was no statistically significant change in the thermal resistance of the samples before and after baking (FIG. 4 D) for three of the four sample types tested. There was a slight increase in the thermal resistance of the 2-spray P3HT sample after thermal baking. Both PS and P3HT have been demonstrated to be chemically stable at temperatures above 130° C. 18, 24, so the increase in resistance observed for the 2-spray P3HT samples is likely due to other factors such as local spot-to-spot variation in the CNT forest morphology or loosening of the interface bond during sample handling.

The overall results from thermal baking suggest that the polymer coatings used here are stable over the studied temperature range and that the process may be suitable for integration with high-power density devices. The thermal resistances of bare CNT-coated foil interposers in a dry contact arrangement were measured to be 21±4 mm$^2$–K/W. The thermal resistances of interposers spray coated and bonded with 1 spray of P3HT were measured to be 9±2 mm$^2$–K/W; an approximate twofold decrease in resistance. Three samples of each configuration were produced and the uncertainty in the thermal resistance was dominated by the variability between samples.

The thermal resistance increased with increasing CNT forest height for each of the sample configurations studied. One cause for the observed trend is apparent; increasing the height of the CNT forest increases the amount of material through which the heat must travel, hence increasing the resistance of the CNT layer itself A second cause is more subtle and is specific to the CNT growth process. During the CNT growth certain regions of the forest grow at greater or lesser rates compared to the average growth rate due to slight discrepancies in the condition of the catalyst particles and their access to the carbon gas source. As the forest grows the difference in height between the different growing regions is increased, resulting in decreased height uniformity with growth time. The decreased uniformity of the CNT forest is equivalent to an increase in the surface roughness of the CNT forest. This increase in surface roughness can be observed using scanning electron microscopy, and leads to a decrease in the contact area at the interface and an increase in the thermal contact resistance. Additional factors related to growth process, such as CNT pullout at the growth substrate and changes in morphology with growth time, may also contribute to increases in the thermal resistance with increasing forest height.

Since the polymer spray coating process was only observed to apply polymer to the CNT tips it is reasonable to assume that the bonding process only leads to significant changes in the thermal contact resistance at the CNT tips, and that the thermal resistance of the CNT forest and the thermal contact resistance at the growth substrate are not affected significantly. Overall, bonding with both P3HT and PS was observed to decrease the resistance of CNT forests comparably, ruling out any contributions from polymer structure or differences in the nature of the polymer-CNT interactions.

Figure 5A:
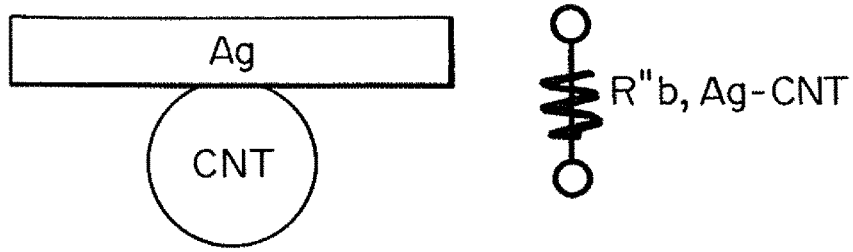
FIGS. 5A and 5B are illustrations of CNT dry contact and polymer bonded contact configurations respectively and the associated thermal resistance network.
Figure 5B:
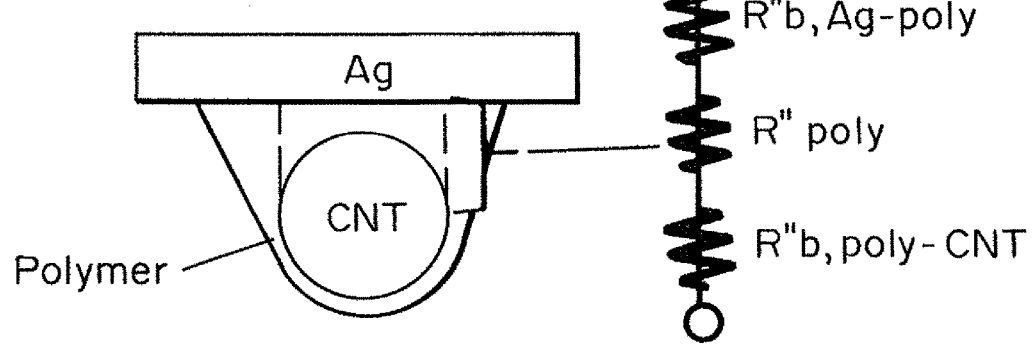

Therefore, to better understand the source of the reduction in the thermal resistance, we considered how the polymer might affect the heat transfer between a single CNT in side-contact with the Ag foil, as shown in FIG. 5. To observe the structure of bonded interfaces spray coated CNT forests were bonded to Si substrates, to which the adhesion was negligible, then disassembled and examined using SEM. The configuration of a polymer bonded CNT (FIGS. 5 A and B) was assumed for the subsequent theoretical heat transfer analysis based on the SEM images.

Heat transfer for the case without any polymer has been analyzed and shown to be dominated by the ballistic surface resistance. The ballistic resistance considers the flow of phonons through the contact as free molecular flow through an orifice with a transmission coefficient derived from diffuse mismatch assumptions and Chen's gray medium approach. The contact area normalized ballistic resistance is given by:

$$R_b'' = \frac{4(C_{l,1} \cdot v_{g,1} + C_{l,2} \cdot v_{g,2})}{C_{l,1} \cdot v_{g,1} \cdot C_{l,2} \cdot v_{g,2}} \quad (1)$$

where $C_l$ is the lattice specific heat, $v_g$ is the phonon group velocity, and the subscripts 1 and 2 are used to denote materials on opposite sides of the interface.

Taking $v_{g,CNT}=1000$ m/s as the through basal plane velocity for graphite, $C_{l,CNT}=1582$ kJ/m$^3$-K, $v_{g,Ag}=1640$ m/s, and $C_{l,Ag}=2362$ kJ/m$^3$-K the contact area normalized resistance for a single Ag-CNT contact is:

$$R_{Ag-CNT}'' = 3.6 \cdot 10^{-3} [\text{mm}^2 K/W]$$

When polymer is added as is shown in FIG. 5 B the resistance of the interface can be approximated by the sum of the ballistic resistance between the Ag and the polymer, the ballistic resistance between the polymer and the CNT, and the resistance of the polymer layer itself. The contact area normalized resistance of the polymer layer is given by the classical expression:

$$R_{poly}'' = \frac{l}{k_{poly}} \quad (2)$$

where l is the thickness of the polymer layer and $k_{poly}$ is the polymer thermal conductivity.

Assuming l=10 nm, which is reasonable based on the polymer accumulation observed at CNT tips in FIGS. 4 A and B, and taking PS as the polymer since its properties are widely known, $k_{PS}=0.25$ W/m-K, the contact area normalized resistance for a polymer coated CNT becomes:

$$R_{Ag-PS-CNT}''=4.6 \cdot 10^{-2} [\text{mm}^2 K/W].$$

This result indicates that under the prescribed assumptions the polymer actually increases contact area normalized thermal resistance by an order of magnitude. The resistance of the polymer layer, $R_{poly}''$, causes most of this increase because of its low thermal conductivity. Therefore, adding the polymer must increase the contact area by greater than an order of magnitude compared to CNT dry contact to reduce the total resistance of the interface. Assuming a van der Waals interaction and elastic contact, a CNT with a diameter of 8 nm will only have a contact width of approximately 1 nm with the Ag foil. Should the polymer fill the interstitial space between the CNT and the foil to the extent of the CNT diameter, it would increase the contact area by a factor of 8.

Measurement of Sheer Attachment Strength

Figure 6:
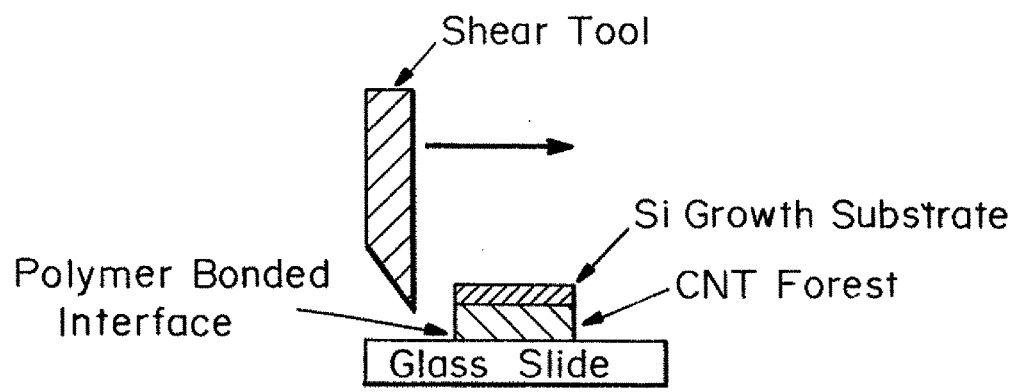
FIG. 6 is a schematic of the die shear apparatus and sample configuration used to measure the shear attachment strength of polymer spray coated and bonded interfaces.

The shear attachment strength of CNT forests spray coated and bonded with polymer to Ag coated (300 nm) glass slides was measured using a die shear apparatus (Nordson DAGE 4000). A schematic is shown in FIG. 6.

Measurements of the shear attachment strength of CNT forests that were polymer bonded to glass slides coated with Ag revealed average attachment strength of 290 kPa. This is a more than threefold increase over reported values for shear attachment strength of CNTs in dry contact with glass slides. The increase in attachment strength from polymer bonding corresponds to an increase in area that is similar in magnitude to the increase in area that would be achieved from filling the space between the CNT and Ag with polymer (FIG. 4). This suggests that adding the polymer might increase the contact area in this manner. Furthermore, it has been reported that the real contact area in CNT forest TIMs is only ~1% of the apparent area. Similarly, it has been estimated that only 0.35% of the volume fraction of CNT forests effectively participate in heat transfer in CNT forest TIMs. Therefore, the polymer might also increase the contact area by engaging additional CNTs, especially since capillary forces associated with drying of solvent during the bonding process likely draw additional CNT tips closer to the interface as illustrated in FIG. 2.

It is pertinent to note that in the above calculations the ballistic resistance assumes that the interface is bonded perfectly. This assumption is likely not valid for the weak van der Waals interactions present at both the dry contact and polymer bonded interfaces. As a result, the above calculations for the CNT-Ag, CNT-polymer, and Ag-polymer contacts likely under predict the thermal resistance. While it is difficult to accurately calculate or measure the thermal resistance of a CNT tip in both dry contact and polymer bonded arrangements, the simple analysis presented here has shown that adding polymer does not reduce the area normalized thermal resistance of CNT contacts; it instead extends the area available for heat transfer at the contacts to CNT tips.

Polymer coating and bonding was demonstrated as an effective means for increasing the contact area and reducing the thermal resistance of CNT forest thermal interfaces. The bonding process added nanoscale coatings of polymer around individual CNT contacts and ostensibly pulled, through capillary action, additional CNTs close to the interface to increase contact area. Spray coating with polystyrene and poly 3-hexylthiophene produced CNT TIMs with thermal resistances of 8.5±0.5 and 4.9±0.3 mm²-K/W, respectively, comparable to conventional solder TIMs. The thermal resistances did not change significantly after baking at 130° C. for 110 hrs. The thermal resistances of dry and polymer bonded CNT interfaces were measured to increase with CNT forest height because of increased surface roughness on taller forests. The relatively low cost of polystyrene in addition to favorable bonding conditions, i.e. room temperature and low pressure (138 kPa), make the coating and bonding process attractive for large-scale implementation. As a demonstration of how the process might be scaled, CNT forests were grown on both sides of Al foil to create an interposer material with a thermal resistance of 9±2 mm²-K/W when bonded.

Effect of Coating on CNT Morphology

SEM images were captured of CNT arrays bonded with P3HT to determine the effect of the P3HT on the CNT morphology. There is limited information available on the interaction between CNTs and P3HT, although it has been reported that the π-conjugated structure of P3HT strongly interacted with CNTs. The difficulty with investigating the bonding between CNTs and silver foil using P3HT is that it is not possible to look at the surface while it is bonded. Instead, it was necessary to pull the foil off the CNTs and observe what remains.

One important way to gauge the quality of the bond is whether the CNT array or sheet remains on the substrate or if it delaminates and adheres to the silver foil. In this case it was observed that the CNTs delaminate from their substrate and remain attached to the silver foil. This is an indication of strong bonding, that the adhesion of the CNTs to the foil is stronger than that of the substrate on which they were originally grown. The majority of the nanotubes remained bonded to the silver foil, indicating that the bond created with the P3HT is stronger than the adhesion to the silicon substrate.

The CNTs appear to remain well aligned, although they were lying flat rather than oriented vertical out of the page. This is believed to be an artifact of the delamination process. The critical observation that can be made from these images is that array remained well aligned, and no clumping occurred. In preliminary testing, a dip-coating process compared with spray-coating. When dip-coating the CNTs in a solution of P3HT and chloroform, it was discovered that the array morphology was significantly altered in the process of evaporating the chloroform. The capillary forces during evaporation tended to clump the CNT arrays together while pulling a fraction of the CNTs off of the substrate which formed islands of CNTs on the substrate.

This clumping effect is undesirable since a portion of the CNTs have come detached from the substrate which reduces the effective area for heat transfer. Unaltered CNT arrays showed no voids in the array. In contrast, the dip-coated CNTs exhibited voids caused by the capillary forces during evaporation of the solvent. The main difference between the spray coated CNTs and the undisturbed CNT array is that the spray coated CNTs have been pulled sideways by the delamination process. Otherwise the aligned nature of the CNT array remained in tact.

We claim:

1. A coated array or sheet of carbon nanotubes comprising an array comprising a substrate and a plurality of vertically aligned carbon nanotubes attached to or supported by the substrate, wherein the plurality of vertically aligned carbon nanotubes are present at a density between about $1 \times 10^7$ and $1 \times 10^{11}$ carbon nanotubes per mm² on the substrate, or a sheet comprising a plurality of carbon nanotubes aligned in plane with the sheet surface, and wherein tips of the plurality of vertically aligned carbon nanotubes of the array or tips of the plurality of carbon nanotubes aligned in plane with the sheet surface are coated with an effective amount of a conformal coating to reduce thermal resistance of the plurality of vertically aligned carbon nanotubes of the array or the plurality of carbon nanotubes aligned in plane with the sheet surface, as compared to an array or sheet having uncoated carbon nanotube tips when measured by a photoacoustic method, wherein the plurality of vertically aligned carbon nanotubes of the array or the plurality of carbon nanotubes aligned in plane with the sheet surface, each comprising sidewalls of the carbon nanotubes which are uncoated by the conformal coating, wherein the conformal coating is a flowable material selected from the group consisting of conjugated polymers, non-conjugated polymers, wax, hot glue, hot melt adhesive, and combinations thereof; and wherein the conformal coating on the tips of the carbon nanotubes of the array or the sheet has a thickness between 1 and 1000 nm.

2. The array or sheet of claim 1, wherein at least 90% of the plurality of vertically aligned carbon nanotubes of the array or of the plurality of carbon nanotubes aligned in plane with the sheet surface remain on the surface after sonication in ethanol.

3. The array or sheet of claim 1, wherein the conformal coating bonds to the tips of the plurality of vertically aligned carbon nanotubes of the array or to the tips of the plurality of carbon nanotubes aligned in plane with the sheet surface through van der Waals bonds, π-π stacking, mechanical wrapping and/or covalent bonds.

4. The array or sheet of claim 1, the substrate comprises a metal, metal oxide and/or semiconductor material and wherein the conformal coating bonds to the metal, metal oxide, or semiconductor material surfaces through van der Waals bonds, π-π stacking, and/or covalent bonds.

5. The array or sheet of claim 1, wherein the conjugated polymer is an aromatic, heteroaromatic, or non-aromatic polymer.

6. The array or sheet of claim 1, wherein the conjugated polymer is selected from the group consisting of polythiophenes, polystyrenes, polypyrroles, polyacetylenes, polyanilines, polyfluorenes, polyphenylenes, polypyrenes, polyazulenes, polynaphthalenes, polycarbazoles, polyindoles, polyazepines, poly(3,4-ethylenedioxythiophenes), poly(p-phenyl sulfides), poly(p-phenylene vinylene), polyacetylenes, polydiacetylenes, and combinations thereof.

7. The array or sheet of claim 6, wherein the conjugated polymer is a polystyrene.

8. The array or sheet of claim 6, wherein the conjugated polymer is a polythiophene.

9. The array or sheet of claim 8, wherein the polythiophene is poly(3-hexylthiophene).

10. The array or sheet of claim 1, wherein the non-conjugated polymer is selected from the group consisting of polyvinyl alcohol, poly(methyl methacrylate), polydimethylsiloxane, and combinations thereof.

11. The array or sheet of claim 1, wherein the wax is selected from the group consisting of paraffin wax, synthetic wax, and polyethylene waxes.

12. The array or sheet of claim 11, wherein the wax has a melting temperature above 80, 90, 100, 110, 120° C., or 130° C.

13. The array or sheet of claim 1, wherein the hot glue or hot melt adhesive combines a wax, tackifiers, a polymer base, or combinations thereof.

14. The array or sheet of claim 1, wherein the conformal coating is present in an amount effective to reduce the thermal resistance of the array by about 50%, as compared to the array or sheet having uncoated carbon nanotube tips.

15. The array or sheet of claim 1, wherein shear adhesive strength of the array or sheet having the conformally coated tips on a glass slide is at least about two-fold greater than the shear adhesive strength of the array or sheet having uncoated carbon nanotube tips on a glass slide.

16. The array or sheet of claim 1, further comprising a plurality of metallic particles.

17. The array or sheet of claim 16, wherein the metallic particles are selected from the group consisting of palladium nanoparticles, gold nanoparticles, silver nanoparticles, titanium nanoparticles, iron nanoparticles, nickel nanoparticles, copper nanoparticles, and combinations thereof.

18. The array or sheet of claim 1, further comprising one or more flowable or phase change materials that displace air between the carbon nanotubes and improve contact of the distal ends of the carbon nanotubes to a surface.

19. The array or sheet of claim 18, wherein the one or more flowable phase change materials are selected from the group consisting of paraffin waxes, polyethylene waxes, hydrocarbon-based waxes, and blends thereof.

20. A method of making the coated carbon nanotube array or sheet of claim 1, the method comprising the steps of
providing an array or sheet comprising a plurality of vertically aligned carbon nanotubes, and
conformally coating tips of the vertically aligned carbon nanotubes of the array or sheet with one or more conformal coating materials in an amount effective to lower the thermal resistance of the vertically aligned carbon nanotubes of the array or sheet;
wherein the plurality of the vertically aligned carbon nanotubes of the array or sheet each comprise sidewalls of the carbon nanotubes which are uncoated by the one or more conformal coating materials,
wherein the one or more coating materials is a flowable material selected from the group consisting of conjugated polymers, non-conjugated polymers, wax, hot glue, hot melt adhesive, and combinations thereof; and
wherein the conformal coating on the tips of the vertically aligned carbon nanotubes of the array or sheet has a thickness between 1 and 1000 nm.

21. The method of claim 20, wherein the one or more coating materials are spray coated onto the array or sheet or are coated onto the array or sheet using electrochemical deposition.

22. The method of claim 20, further comprising exposing the coating to a solvent or solvents to form a gel or viscous liquid and pressing the coated nanotube array or sheet to allow the coating to flow and fill interface voids.

23. The method of claim 22, further comprising removing the solvent or solvent to solidify the coating.

24. The array or sheet of claim 1, wherein the conformal coating has a thickness between 1 and 500 nm.

25. The array or sheet of claim 1, wherein the conformal coating has a thickness between 1 and 100 nm.

26. The array or sheet of claim 1, wherein the conformal coating has a thickness between 1 and 50 nm.

27. The array or sheet of claim 1, wherein the plurality of vertically aligned carbon nanotubes of the array or the plurality of carbon nanotubes aligned in plane with the sheet surface each comprise void space between the sidewalls of the carbon nanotubes.

* * * * *